(12) United States Patent
Park et al.

(10) Patent No.: US 11,463,106 B2
(45) Date of Patent: Oct. 4, 2022

(54) ZERO PADDING APPARATUS FOR ENCODING FIXED-LENGTH SIGNALING INFORMATION AND ZERO PADDING METHOD USING SAME

(71) Applicant: Electronics and Telecommunications Research Institute, Daejeon (KR)

(72) Inventors: Sung-Ik Park, Daejeon (KR); Sun-Hyoung Kwon, Daejeon (KR); Jae-Young Lee, Daejeon (KR); Heung-Mook Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/202,475

(22) Filed: Mar. 16, 2021

(65) Prior Publication Data

US 2021/0203358 A1 Jul. 1, 2021

Related U.S. Application Data

(63) Continuation of application No. 16/390,316, filed on Apr. 22, 2019, now Pat. No. 10,992,316, which is a (Continued)

(30) Foreign Application Priority Data

Feb. 27, 2015 (KR) .................. 10-2015-0028060
Mar. 6, 2015 (KR) .................. 10-2015-0031947
Feb. 22, 2016 (KR) .................. 10-2016-0020636

(51) Int. Cl.
*G06F 11/00* (2006.01)
*H03M 13/00* (2006.01)
(Continued)

(52) U.S. Cl.
CPC .... *H03M 13/1148* (2013.01); *H03M 13/1105* (2013.01); *H03M 13/1165* (2013.01); (Continued)

(58) Field of Classification Search
CPC ......... H03M 13/1148; H03M 13/1105; H03M 13/2778; H03M 13/1165; H03M 13/255; (Continued)

(56) References Cited

U.S. PATENT DOCUMENTS 9,214,960 B2 12/2015 Jeong et al.
2015/0012803 A1* 1/2015 Jeong .................. H04L 1/0013
714/776
(Continued)

FOREIGN PATENT DOCUMENTS

EP 2 096 761 A1 9/2009
EP 2 477 335 A2 7/2012
(Continued)

OTHER PUBLICATIONS

International Search Report issued in counterpart International Application No. PCT/KR2016/001756 dated Jul. 13, 2016 (3 pages in English; 14 pages in Korean).

*Primary Examiner* — Samir W Rizk
(74) *Attorney, Agent, or Firm* — NSIP Law

(57) ABSTRACT

A zero padding apparatus and method for fixed length signaling information are disclosed. A zero padding apparatus according to an embodiment of the present invention includes a processor configured to generate a LDPC information bit string by deciding a number of groups whose all bits are to be filled with 0 using a difference between a length of the LDPC information bit string and a length of a BCH-encoded bit string, selecting the groups using a shortening pattern order to fill all the bits of the groups with 0, and filling at least a part of remaining groups, which are not (Continued)

filled with 0, with the BCH-encoded bit string; and memory configured to provide the LDPC information bit string to an LDPC encoder.

4 Claims, 8 Drawing Sheets

Related U.S. Application Data continuation of application No. 15/553,458, filed as application No. PCT/KR2016/001756 on Feb. 23, 2016, now Pat. No. 10,320,418.

(51) Int. Cl.
| | |
|---|---|
| *H03M 13/11* | (2006.01) |
| *H03M 13/25* | (2006.01) |
| *H03M 13/27* | (2006.01) |
| *H03M 13/29* | (2006.01) |
| *H03M 13/15* | (2006.01) |
| *G06T 7/162* | (2017.01) |
| *H04W 72/04* | (2009.01) |

(52) U.S. Cl.
CPC ......... *H03M 13/255* (2013.01); *H03M 13/27* (2013.01); *H03M 13/2778* (2013.01); *H03M 13/2906* (2013.01); *H03M 13/618* (2013.01); *H03M 13/6362* (2013.01); *G06T 7/162* (2017.01); *H03M 13/1102* (2013.01); *H03M 13/1111* (2013.01); *H03M 13/152* (2013.01); *H04W 72/0466* (2013.01)

(58) Field of Classification Search
CPC ............. H03M 13/27; H03M 13/2906; H03M 13/618; H03M 13/6362
See application file for complete search history.

(56) References Cited

U.S. PATENT DOCUMENTS

| | | |
|---|---|---|
| 2015/0082131 A1 | 3/2015 | Jeong et al. |
| 2019/0229750 A1 | 7/2019 | Park et al. |
| 2021/0314002 A1 | 10/2021 | Myung et al. |

FOREIGN PATENT DOCUMENTS

| | | |
|---|---|---|
| EP | 2 768 146 A2 | 8/2014 |
| KR | 10-2009-0092196 A | 8/2009 |
| KR | 10-2010-0029239 A | 3/2010 |
| KR | 10-2011-0065393 A | 6/2011 |
| KR | 10-2012-0083858 A | 7/2012 |
| KR | 10-2013-0038782 A | 4/2013 |
| KR | 10-2015-0005475 A | 1/2015 |
| WO | WO 2008/149216 A2 | 12/2008 |
| WO | WO 2016/137205 A1 | 1/2016 |

\* cited by examiner

ZERO PADDING APPARATUS FOR ENCODING FIXED-LENGTH SIGNALING INFORMATION AND ZERO PADDING METHOD USING SAME

CROSS-REFERENCE TO RELATED APPLICATIONS

This application is a Continuation Application of U.S. patent application Ser. No. 16/390,316, filed on Apr. 22, 2019, which is a Continuation Application of U.S. patent application Ser. No. 15/553,458 filed on Aug. 24, 2017, now U.S. Pat. No. 10,320,418, which claims the benefit under 35 USC 119(a) of PCT Application No. PCT/KR2016/001756, filed on Feb. 23, 2016, which claims the benefit of Korean Patent Application No. 10-2015-0028060, filed Feb. 27, 2015, Korean Patent Application No. 10-2015-0031947, filed Mar. 6, 2015, and Korean Patent Application No. 10-2016-0020636 filed Feb. 22, 2016 in the Korean Intellectual Property Office, the entire disclosure of which is incorporated herein by reference for all purposes.

TECHNICAL FIELD

The present invention relates to channel encoding and modulation techniques for the transmission of signaling information, and more particularly to encoding and decoding apparatuses for effectively transmitting signaling information in a next generation digital broadcasting system.

BACKGROUND ART

Bit-Interleaved Coded Modulation (BICM) is bandwidth-efficient transmission technology, and is implemented in such a manner that an error-correction coder, a bit-by-bit interleaves and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

Such BICM may be used not only for the transmission of data but also for the transmission of signaling information. In particular, channel encoding and modulation techniques for the transmission of signaling information need to be more robust than channel encoding and modulation techniques for the transmission of data.

Therefore, in particular, there is a pressing need for new channel encoding and modulation techniques for the transmission of signaling information.

DISCLOSURE

Technical Problem

An object of the present invention is to provide channel encoding and modulation techniques that are appropriate for the transmission of signaling information via a broadcast system channel.

Another object of the present invention is to provide a new zero padding technique that is optimized for the transmission of signaling information.

Technical Solution

In order to accomplish the above objects, the present invention provides a zero padding apparatus, including: a processor configured to generate a LDPC information bit string by deciding a number of groups whose all bits are to be filled with 0 using a difference between a length of the LDPC information bit string and a length of a BCH-encoded bit string, selecting the groups using a shortening pattern order to fill all the bits of the groups with 0, and filling at least a part of remaining groups, which are not filled with 0, with the BCH-encoded bit string; and memory configured to provide the LDPC information bit string to an LDPC encoder.

In this case, the BCH-encoded bit string may correspond to fixed length signaling information.

In this case, each of the groups may include 360 bits, the LDPC information bit string may include 3240 bits, and the LDPC encoder may correspond to an LDPC codeword whose length is 16200 and whose code rate is 3/15.

In this case, the processor may decide a group which is partially to be filled with 0 using the shortening pattern order, and fill a number of bits corresponding to a number decided by using the difference between the length of the LDPC information bit string and the length of the BCH-encoded bit string with 0 from the start of the group.

In this case, the shortening pattern order may be defined for 9 groups.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

In this case, the LDPC codeword may be used for parity permutation which is performed by group-wise interleaving corresponding to an order of group-wise interleaving and a part of parity bits of the LDPC codeword is punctured after the parity permutation.

Furthermore, according to an embodiment of the present invention, there is provided a zero padding method, including: deciding a number of groups whose all bits are to be filled with 0 using a difference between a length of an LDPC information bit string and a length of a BCH-encoded bit string; selecting the groups using a shortening pattern order; filling all the bits of the groups with 0; and generating the LDPC information bit string by filling at least a part of remaining groups which are not filled with 0, with the BCH-encoded bit string.

In this case, the BCH-encoded bit string may correspond to fixed length signaling information.

In this case, the zero padding method may further comprise providing the LDPC information bit string to an LDPC encoder.

In this case, each of the groups may include 360 bits, the LDPC information bit string may include 3240 bits, and the LDPC encoder may correspond to an LDPC codeword whose length is 16200 and whose code rate is 3/15.

In this case, the zero padding method may further comprise deciding a group which is partially to be filled with 0 using the shortening pattern order; and filling a number of bits corresponding to a number decided by using the difference between the length of the LDPC information bit string and the length of the BCH-encoded bit string with 0 from the start of the group.

In this case, the shortening pattern order may be defined for 9 groups.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

In this case, the LDPC codeword may be used for parity permutation which is performed by group-wise interleaving corresponding to an order of group-wise interleaving and a part of parity bits of the LDPC codeword is punctured after the parity permutation.

Furthermore, according to an embodiment of the present invention, there is provided an inverse zero padding apparatus, including: memory configured to receive an LDPC information bit string from an LDPC decoder; and a processor configured to select groups whose all bits are filled with 0 using a shortening pattern order and generate a BCH-encoded bit string from the LDPC information bit string using remaining groups exclusive of the groups.

In this case, the BCH-encoded bit string may correspond to fixed length signaling information.

In this case, each of the groups may include 360 bits, the LDPC information bit string may include 3240 bits, and the LDPC encoder may correspond to an LDPC codeword whose length is 16200 and whose code rate is 3/15.

In this case, the shortening pattern order may be defined for 9 groups.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

Advantageous Effects

According to the present invention, the channel encoding and modulation techniques that are appropriate for the transmission of signaling information via a broadcast system channel are provided.

Furthermore, in the present invention, shortening and puncturing are optimized according to the amount of signaling information in the construction of BICM for the transmission of signaling information, thereby being able to efficiently transmit/receive the signaling information.

MODE FOR INVENTION

Figure 1:
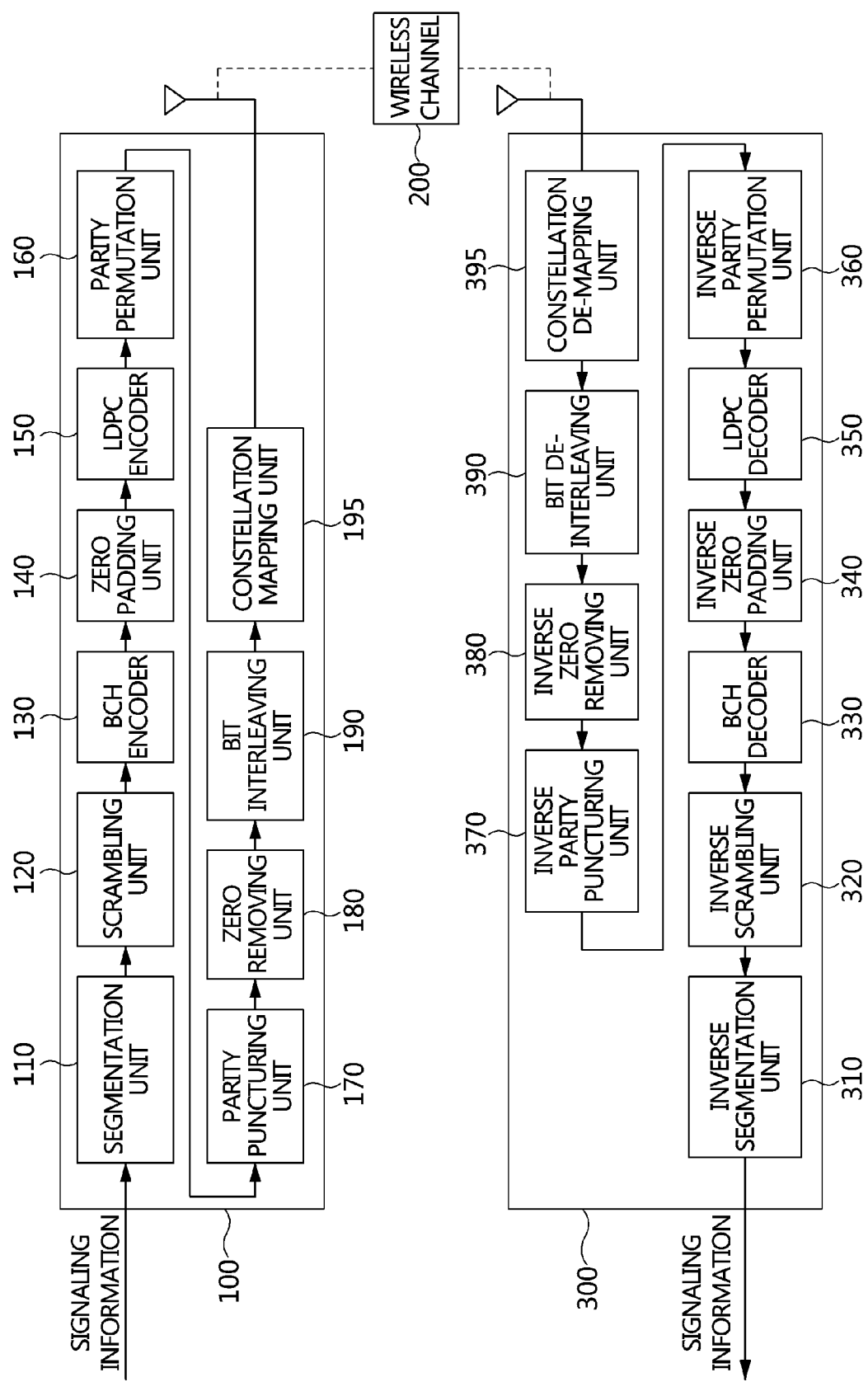
FIG. 1 is a block diagram showing a signaling information encoding/decoding system according to an embodiment of the present invention.

The present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Preferred embodiments of the present invention will be described in detail below with reference to the accompanying drawings.

FIG. 1 is a block diagram showing a signaling information encoding/decoding system according to an embodiment of the present invention.

Referring to FIG. 1, the signaling information encoding/decoding system includes a signaling information encoding apparatus 100, and a signaling information decoding apparatus 300.

The signaling information encoding apparatus 100 and the signaling information decoding apparatus 300 perform communication through the medium of a wireless channel 200.

The signaling information encoding apparatus 100 channel-encodes and modulates signaling information, such as L1-Basic, L1-Detail or the like.

The signaling information encoding apparatus 100 includes a segmentation unit 110, a scrambling unit 120, a BCH encoder 130, a zero padding unit 140, an LDPC encoder 150, a parity permutation unit 160, a parity puncturing unit 170, a zero removing unit 180, a bit interleaving unit 190, and a constellation mapping unit 195.

The signaling information encoding apparatus 100 shown in FIG. 1 may be viewed as corresponding to a Bit-Interleaved Coded Modulation (BICM) apparatus. In this case, the error correction encoder of the BICM apparatus may be viewed as corresponding to the segmentation unit 110, the scrambling unit 120, the BCH encoder 130, the zero padding unit 140, the LDPC encoder 150, the parity permutation unit 160, the parity puncturing unit 170, and the zero removing unit 180 that are shown in FIG. 1.

When the length of the signaling information is longer than a preset length, the segmentation unit 110 segments the signaling information into a plurality of groups in order to segment the signaling information into a plurality of LDPC codewords and then transmit the LDPC codewords. That is, when the signaling information cannot be contained in a single LDPC codeword, the segmentation unit may determine the number of codewords in which the signaling information is to be contained, and then may segment the signaling information according to the determined number of codewords.

For example, when the length of the signaling information is fixed like L1-Basic, the signaling information encoding apparatus 100 may not include the segmentation unit 110.

For example, when the length of the signaling information is variable like Detail, the signaling information encoding apparatus 100 may include the segmentation unit 110.

The scrambling unit 120 performs scrambling in order to protect the signaling information. In this case, the scrambling may be performed using various methods that are known in the present technical field.

The BCH encoder 130 performs BCH encoding using a BCH parity whose parity length $N_{bch\_Parity}$ is 168 bits.

In this case, the BCH encoding may be the same as BCH encoding for LDPC code in which the length of data BICM is 16200.

In this case, a BCH polynomial used for the BCH encoding may be expressed in Table 1 below, and the BCH encoding expressed in Table 1 may have 12-bit error correction capability:

TABLE 1

| Code Length $N_{ldpc}$ = 16200 | |
|---|---|
| $g_1(x)$ | $1 + x + x^3 + x^5 + x^{14}$ |
| $g_2(x)$ | $1 + x^6 + x^8 + x^{11} + x^{14}$ |
| $g_3(x)$ | $1 + x + x^2 + x^6 + x^9 + x^{10} + x^{14}$ |
| $g_4(x)$ | $1 + x^4 + x^7 + x^8 + x^{10} + x^{12} + x^{14}$ |
| $g_5(x)$ | $1 + x^2 + x^4 + x^6 + x^8 + x^9 + x^{11} + x^{13} + x^{14}$ |
| $g_6(x)$ | $1 + x^3 + x^7 + x^8 + x^9 + x^{13} + x^{14}$ |
| $g_7(x)$ | $1 + x^2 + x^5 + x^6 + x^7 + x^{10} + x^{11} + x^{13} + x^{14}$ |
| $g_8(x)$ | $1 + x^5 + x^8 + x^9 + x^{10} + x^{11} + x^{14}$ |
| $g_9(x)$ | $1 + x + x^2 + x^3 + x^9 + x^{10} + x^{14}$ |
| $g_{10}(x)$ | $1 + x^3 + x^6 + x^9 + x^{11} + x^{12} + x^{14}$ |
| $g_{11}(x)$ | $1 + x^4 + x^{11} + x^{12} + x^{14}$ |
| $g_{12}(x)$ | $1 + x + x^2 + x^3 + x^5 + x^6 + x^7 + x^8 + x^{10} + x^{13} + x^{14}$ |

After the BCH encoding has been performed, the zero padding unit 140 performs zero padding or shortening.

In this case, the zero padding means that part of a bit string is filled with bit "0."

As a result of the BCH encoding, the length of the bit string may be expressed by $N_{bch}=K_{sig}+b_{ch\_Parity}$. In this case, $K_{sig}$ may be the number of information bits of the BCH encoding. For example, when $K_{sig}$ is fixed to 200 bits like L1-Signaling information, $N_{bch}$ may be 368 bits.

When the LDPC encoder 150 uses an LDPC code whose code rate is 3/15 and whose length is 16200, the information length $K_{ldpc}$ of the LDPC code is 3240 bits. In this case, since information that is to be actually transmitted is $N_{bch}$ bits and the length of the information part of the LDPC code is $K_{ldpc}$ bits, zero padding, i.e., the process of filling bits corresponding to $K_{ldpc}-N_{bch}$ with bit "0," is performed. $K_{ldpc}-N_{bch}$ may be 2872 in case of L1-Basic information.

In this case, the order of the zero padding plays an important role in determining the performance of the encoder, and the order of zero padding may be expressed as shortening pattern order.

In this case, the bits padded with zeros are used only for LDPC encoding, and are not actually transmitted.

The LDPC information bits composed of $K_{ldpc}$ bits is segmented into $N_{info\_group}$ groups, as shown in Equation 1 below. For example, when $K_{ldpc}$ is 3240, $N_{info\_group}$ is 9, and thus the LDPC information bits may be grouped into 9 groups.

$$Z_j = \{j_k | 360 \times j \le k < 360 \times (j+1)\} \text{ for } 0 \le j < N_{info\_group} \quad (1)$$

where $Z_j$ is a group composed of 360 bits.

The part of $K_{ldpc}$ bits that is zero-padded is determined according to the following procedure.

(Step 1) First, the number of groups in which all the bits thereof will be padded with "0" is calculated using Equation 2 below:

$$N_{pad} = \left\lfloor \frac{K_{ldpc} - N_{bch}}{360} \right\rfloor \quad (2)$$

For example, when $K_{ldpc}$ is 3240 and $N_{bch}$ is 368, $N_{pad}$ may be 7. The fact that $N_{pad}$ is 7 indicates that the number of groups in which all the bits thereof will be padded with "0" is 7.

(Step 2) When $N_{pad}$ is not 0, zero padding is performed on $N_{pad}$ groups in the order of $Z_{\pi_s(0)}, Z_{\pi_s(1)}, \ldots, Z_{\pi_s(N_{pad}-1)}$ according to the shortening pattern order $\pi_s(j)$ of Table 2 below. In this case, $\pi_s(j)$ may refer to the shortening pattern order of a j-th bit group.

When $N_{pad}$ is 0, the above procedure is omitted.

TABLE 2

| | | $\pi_s(j)$ (0 ≤ j < $N_{group}$) | | | | | | | | |
|---|---|---|---|---|---|---|---|---|---|---|
| MODE | $N_{group}$ | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
| L1-Basic | 9 | 4 | 1 | 5 | 2 | 8 | 6 | 0 | 7 | 3 |

The shortening pattern order of Table 2 above indicates that zero padding targets are selected in the order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3. That is, when only 7 groups are selected as zero padding targets in the example of Table 2 above, a total of 7 groups, i.e., the 5th group indexed as 4, the 2nd group indexed as 1, the 6th group indexed as 5, the 3rd group indexed as 2, the 9th group indexed as 8, the 7th group indexed as 6, and the 1st group indexed as 0, are selected as the zero padding targets.

In particular, the shortening pattern order of Table 2 above may be optimized for fixed length signaling information.

When the number of groups in which all the bits thereof will be padded with "0" and the corresponding groups are determined, all the bits of the determined groups are filled with "0."

(Step 3) Additionally, for a group corresponding to $Z_{\pi_s(N_{pad})}$, bits corresponding to ($K_{ldpc}-N_{bch}-360\times N_{pad}$) from the start of the group are additionally zero-padded. In this case, the fact that zero padding is performed from the start of the corresponding group may indicate that zero padding is performed from a bit corresponding to a smaller index.

(Step 4) After the zero padding has been all completed, an LDPC information bit string is generated by sequentially mapping BCH-encoded $N_{bch}$ bits to a remaining part that has not been zero-padded.

The LDPC encoder 150 performs LDPC encoding using $K_{ldpc}$ and which has been zero-padded and to which signaling information has been mapped.

In this case, the LDPC encoder 150 may correspond to an LDPC codeword whose code rate is 3/15 and whose length is 16200. The LDPC codeword is a systematic code, and the LDPC encoder 150 generates an output vector, such as that of Equation 3 below:

$$\Lambda = (c_0, c_1, \ldots c_{N_{ldpc}-1}) = (i_0, i_1, \ldots, i_{K_{ldpc}-1}, P_0, P_1, \ldots, P_{16200-K_{ldpc}-1}) \quad (3)$$

For example, when $K_{ldpc}$ is 3240, parity bits may be 12960 bits.

The parity permutation unit 160 performs group-wise parity interleaving on a parity part, not an information part, as a preliminary task for parity puncturing.

In this case, the parity permutation unit 160 may perform parity interleaving using Equation 4 below:

$$Y_j = X_j, 0 \leq j < K_{ldpc}/360$$

$$Y_j = X_{\pi(j)}, K_{ldpc}/360 \leq j < 45 \quad (4)$$

where $Y_j$ is a j-th group-wise interleaved bit group, and $\pi(j)$ is the order of group-wise interleaving, which may be defined in Table 3 below:

TABLE 3

Order of Group-wise interleaving
$\pi(j)$ (9 ≤ j < 45)

| Mode | $N_{group}$ | 9 | 10 | 11 | 12 | 13 | 14 | 15 | 16 | 17 | 18 | 19 | 20 |
|------|-------------|----|----|----|----|----|----|----|----|----|----|----|----|
|      |             | 21 | 22 | 23 | 24 | 25 | 26 | 27 | 28 | 29 | 30 | 31 | 32 |
|      |             | 33 | 34 | 35 | 36 | 37 | 38 | 39 | 40 | 41 | 42 | 43 | 44 |
| L1-Basic | 45      | 20 | 23 | 25 | 32 | 38 | 41 | 18 | 9  | 10 | 11 | 31 | 24 |
|      |             | 14 | 15 | 26 | 40 | 33 | 19 | 28 | 34 | 16 | 39 | 27 | 30 |
|      |             | 21 | 44 | 43 | 35 | 42 | 36 | 12 | 13 | 29 | 22 | 37 | 17 |

That is, the parity permutation unit 160 outputs 3240 bits (9 bit groups) corresponding to information bits among the 16200 bits (45 bit groups) of the LDPC codeword without change, groups 12960 parity bits into 36 bit groups each including 360 bits, and interleave the 36 bit groups in the order of group-wise interleaving corresponding to Table 3 above.

The order of group-wise interleaving of Table 3 indicates that a 21th group indexed as 20 is located at a 10th group location indexed as 9, a 24rd group indexed as 23 is located at a list group location indexed as 10, a 26th group indexed as 25 is located at a 12nd group location indexed as 11, . . . , and a 18th bit group indexed as 17 is located at a 45th group location indexed as 44.

In this case, the bit group (the bit group indexed as 20) at a front location may correspond to most important parity bits, and the bit group (the bit group indexed as 17) at a rear location may correspond to least important parity bits.

In particular, the order of group-wise interleaving of Table 3 may be optimized for fixed length signaling information.

After the parity interleaving (parity permutation) has been completed, the parity puncturing unit 170 may puncture the partial parities of the LDPC codeword. The punctured bits are not transmitted. In this case, after the parity interleaving has been completed, parity repetition in which part of the parity-interleaved LDPC parity bits is repeated may be performed before parity puncturing is performed.

The parity puncturing unit 170 calculates a final puncturing size, and punctures bits corresponding to the calculated final puncturing size. The final puncturing size corresponding to the number of bits to be punctured may be calculated according to the length $N_{bch}$ of the BCH-encoded bit string as follows:

(Step 1) A temporary puncturing size $N_{punc\_temp}$ is calculated using Equation 5 below:

$$N_{punc\_temp} = \left\lfloor \frac{A}{2^n} \times (K_{ldpc} - N_{bch}) \right\rfloor + B \quad (5)$$

where $K_{ldpc}$ is the length of the LDPC information bit string, $N_{bch}$ is the length of the BCH-encoded bit string, A is a first integer, and B is a second integer.

In this case, the difference $K_{ldpc} - N_{bch}$ between the length of the LDPC information bit string and the length of the BCH-encoded bit string may correspond to a zero padding length or a shortening length.

The parameters for puncturing required for the calculation of Equation 5 may be defined as in Table 4 below:

TABLE 4

| | $N_{bch}$ | $K_{ldpc}$ | A | B | n | $N_{ldpc\_parity}$ | $\eta_{MOD}$ |
|---|---|---|---|---|---|---|---|
| L1-Basic | 368 | 3240 | 0 | 9360 | 0 | 12960 | 2 | where $N_{ldpc\_parity}$ is the number of parity bits of the LDPC codeword, and $\eta_{MOD}$ is a modulation order. In this case, the modulation order may be 2, which is indicative of QPSK.

In particular, the parameters for puncturing of Table 4 may be optimized for fixed length signaling information.

(Step 2) The temporary number of transmission bits $N_{FFC\_temp}$ is calculated using the calculated temporary puncturing size $N_{punc\_temp}$ and $N_{ldpc\_parity}$ of Table 4, as shown in Equation 6 below:

$$N_{FFC\_temp} = N_{bch} + N_{ldpc\_parity} - N_{punc\_temp} \quad (6)$$

(Step 3) The number of transmission bits $N_{FFC}$ is calculated using the temporary number of transmission bits $N_{FFC\_temp}$, as shown in Equation 7 below:

$$N_{FFC} = \left\lceil \frac{N_{FFC\_temp}}{\eta_{MOD}} \right\rceil \times \eta_{MOD} \quad (7)$$

The number of transmission bits $N_{FFC}$ is the sum of the length of the information part and the length of the parity part after the completion of the puncturing.

(Step 4) A final puncturing size $N_{punc}$ is calculated using the calculated number of transmission bits $N_{FFC}$ as shown in Equation 8 below:

$$N_{punc} = N_{punc\_temp} - (N_{FEC} - N_{FEC\_temp}) \quad (8)$$

where the final puncturing size $N_{punc}$ is the size of parities that need to be punctured.

That is, the parity puncturing unit 170 may puncture the last $N_{punc}$ bits of the whole LDPC codeword on which the parity permutation and the repetition have been performed.

The zero removing unit 180 removes zero-padded bits from the information part of the LDPC codeword.

The bit interleaving unit 190 performs bit interleaving on the zero-removed LDPC codeword. In this case, the bit interleaving may be performed using a method in which the direction in which the LDPC codeword is recorded in memory of a preset size and the direction in which the LDPC codeword is read therefrom are made different.

The constellation mapping unit 195 performs symbol mapping. For example, the constellation mapping unit 195 may be implemented using a QPSK method.

The signaling information decoding apparatus 300 demodulates and channel-decodes signaling information, such as L1-Basic, L1-Detail, or the like.

The signaling information decoding apparatus 300 includes a constellation de-mapping unit 395, a bit de-interleaving unit 390, an inverse zero removing unit 380, an inverse parity puncturing unit 370, an inverse parity permutation unit 360, an LDPC decoder 360, an inverse zero padding unit 340, a BCH decoder 330, an inverse scrambling unit 320, and an inverse segmentation unit 310.

The signaling information decoding apparatus 300 shown in FIG. 1 may be viewed as corresponding to a Bit-Interleaved Coded Modulation (BICM) decoding apparatus. In this case, the error correction decoder of the BICM decoding apparatus may be viewed as corresponding to the inverse zero removing unit 380, the inverse parity puncturing unit 370, the inverse parity permutation unit 360, the LDPC decoder 360, the inverse zero padding unit 340, the BCH decoder 330, the inverse scrambling unit 320 and the inverse segmentation unit 310 that are shown in FIG. 1.

The inverse segmentation unit 310 performs the inverse operation of the segmentation unit 110.

The inverse scrambling unit 320 performs the inverse operation of the scrambling unit 120.

The BCH decoder 330 performs the inverse operation of the BCH encoder 130.

The inverse zero padding unit 340 performs the inverse operation of the zero padding unit 140.

In particular, the inverse zero padding unit 340 may receive an LDPC information bit string from the LDPC decoder 350, may select groups whose all bits are filled with 0 using shortening pattern order, and may generate a BCH-encoded bit string from the LDPC information bit string using groups exclusive of the former groups.

The LDPC decoder 350 performs the inverse operation of the LDPC encoder 150.

The inverse parity permutation unit 360 performs the inverse operation of the parity permutation unit 160.

In particular, the inverse parity permutation unit 360 may segment the parity bits of the LDPC codeword into a plurality of groups, and may group-wise de-interleave the groups using the order of group-wise interleaving, thereby generating an LDPC codeword that is to be LDPC-decoded.

The inverse parity puncturing unit 370 performs the inverse operation of the parity puncturing unit 170.

In this case, the inverse parity puncturing unit 370 may calculate a temporary puncturing size using a first integer, multiplied by the difference between the length of the LDPC information bit string and the length of the BCH-encoded bit string, and a second integer different from the first integer, may calculate the temporary number of transmission bits using the difference between the sum of the length of the BCH-encoded bit string and 12960 and the temporary puncturing size, may calculate the number of transmission bits using the temporary number of transmission bits and modulation order, may calculate a final puncturing size using the temporary number of transmission bits, the number of transmission bits and the temporary number of transmission bits, and may generate an LDPC codeword to be provided to the inverse parity permutation unit 360 by taking into account the final puncturing size.

The inverse zero removing unit 380 performs the inverse operation of the zero removing unit 180.

The bit de-interleaving unit 390 performs the inverse operation of the bit interleaving unit 190.

The constellation de-mapping unit 395 performs the inverse operation of the constellation mapping unit 195.

Figure 2:
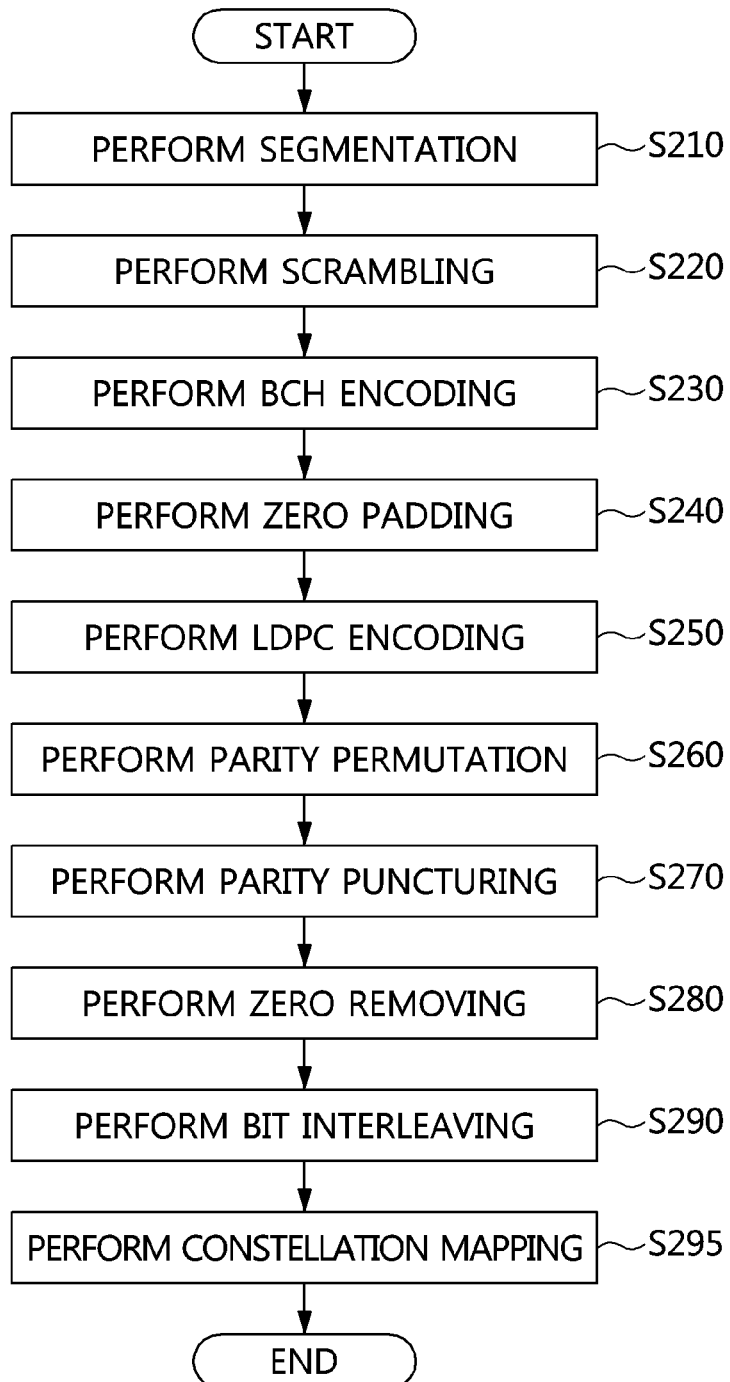
FIG. 2 is an operation flowchart showing a signaling information encoding method according to an embodiment of the present invention.

FIG. 2 is an operation flowchart showing a signaling information encoding method according to an embodiment of the present invention.

Referring to FIG. 2, the signaling information encoding method according to the embodiment of the present invention includes segmenting signaling information into a plurality of groups first at step S210.

At step S210, when the length of the signaling information is longer than a preset length, the signaling information is segmented into a plurality of groups in order to segment the signaling information into a plurality of LDPC codewords and then transmit the LDPC codewords. That is, when the signaling information cannot be contained in a single LDPC codeword, the number of codewords in which the signaling information is to be contained may be determined and then the signaling information may be segmented according to the determined number of codewords at step S210.

For example, when the length of the signaling information is variable like L1-Detail, the signaling information encoding method may include step S210.

For example, when the length of the signaling information is fixed like L1-Basic, the signaling information encoding method may not include step S210.

Furthermore, the signaling information encoding method according to the embodiment of the present invention includes performing scrambling in order to protect the signaling information at step S220.

In this case, the scrambling may be performed using various methods that are known in the present technical field.

Furthermore, the signaling information encoding method according to the embodiment of the present invention includes performing BCH encoding using a BCH parity whose parity length $N_{bch\_Parity}$ is 168 bits at step S230.

Step S230 may be performed by the BCH encoder 130 shown in FIG. 1.

Furthermore, the signaling information encoding method according to the embodiment of the present invention includes performing zero padding or shortening after the BCH encoding has been performed at step S240.

In this case, the zero padding may be performed by the zero padding unit 140 shown in FIG. 1.

Since information that is to be actually transmitted is $N_{bch}$ bits and the length of the information part of the LDPC code is $K_{ldpc}$ bits, zero padding, i.e., the process of filling bits corresponding to $K_{ldpc}-N_{bch}$ with bit "0," is performed at step S240.

The zero padding of step S240 may be performed according to the shortening pattern order of Table 2.

Furthermore, the signaling information encoding method according to the embodiment of the present invention includes performing LDPC encoding using $K_{ldpc}$ and which has been zero-padded and to which signaling information has been mapped at step S250.

In this case, step S250 may be performed by an LDPC encoder corresponding to an LDPC codeword whose code rate is 3/15 and whose length is 16200.

Furthermore, the signaling information encoding method according to the embodiment of the present invention includes performing group-wise parity interleaving on a parity part, not an information part, as a preliminary task for parity puncturing at step S260.

In this case, at step S260, the group-wise parity interleaving may be performed according to the order of group-wise interleaving of Equation 4 and Table 3.

Furthermore, the signaling information encoding method according to the embodiment of the present invention includes puncturing the partial parities of the LDPC codeword after the parity interleaving (parity permutation) has been completed at step S270.

At step S270, the punctured bits are not transmitted.

In this case, after the parity interleaving has been completed, parity repetition in which part of the parity-interleaved LDPC parity bits is repeated may be performed before parity puncturing is performed.

The parity puncturing of step S270 may be performed by the parity puncturing unit 170 shown in FIG. 1.

Furthermore, the signaling information encoding method according to the embodiment of the present invention includes performing zero removing, i.e., the process of removing the zero-padded bits from the information part of the LDPC codeword, at step S280.

Furthermore, the signaling information encoding method according to the embodiment of the present invention includes performing bit interleaving on the zero-removed LDPC codeword at step S290. In this case, step S290 may be performed using a method in which the direction in which the LDPC codeword is recorded in memory of a preset size and the direction in which the LDPC codeword is read therefrom are made different.

Furthermore, the signaling information encoding method according to the embodiment of the present invention includes performing symbol mapping at step S295.

Figure 3:
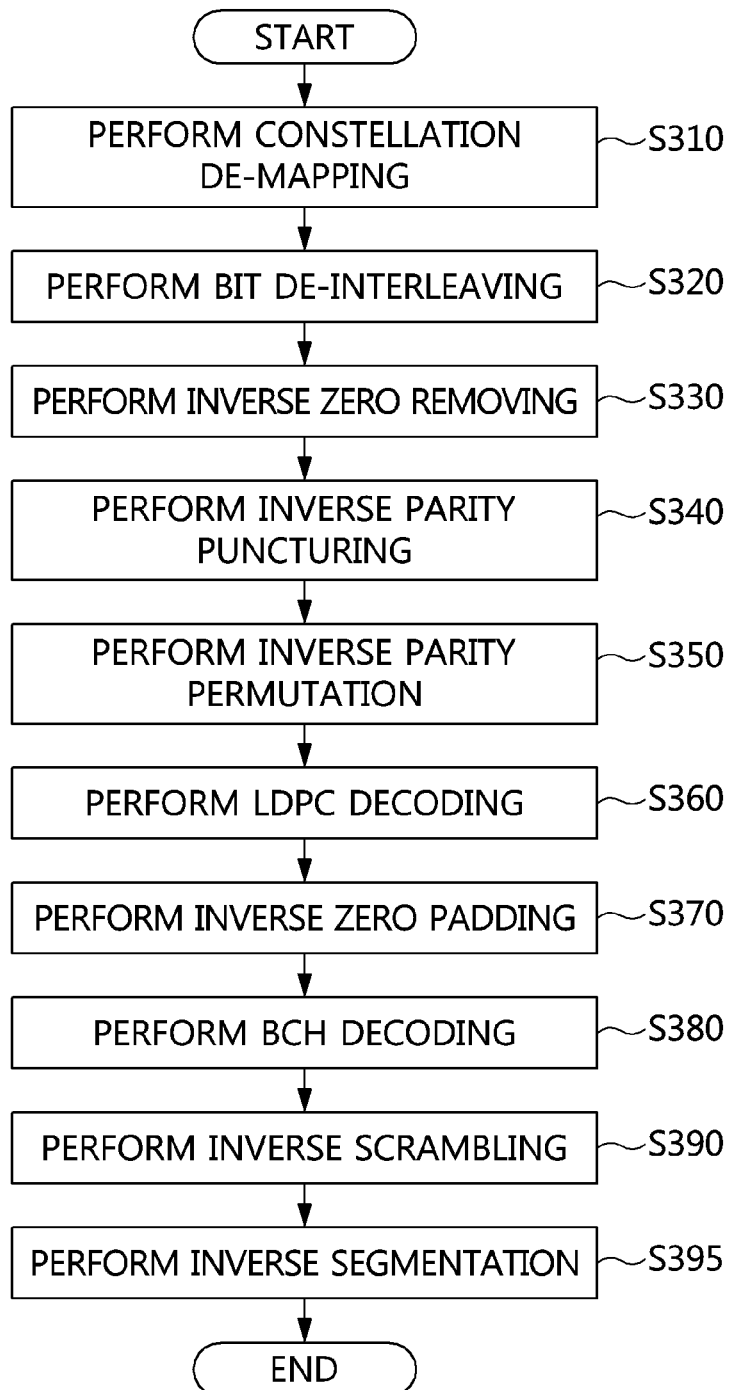
FIG. 3 is an operation flowchart showing a signaling information decoding method according to an embodiment of the present invention.

FIG. 3 is an operation flowchart showing a signaling information decoding method according to an embodiment of the present invention.

Referring to FIG. 3, the signaling information decoding method according to the embodiment of the present invention includes performing constellation de-mapping on a signal received via an antenna at step S310.

In this case, step S310 may correspond to the inverse operation of step S295 shown in FIG. 2, and may be performed by the constellation de-mapping unit 395 shown in FIG. 1.

Furthermore, the signaling information decoding method according to the embodiment of the present invention includes performing bit de-interleaving at step S320.

In this case, step S320 may correspond to the inverse operation of step S290 shown in FIG. 2, and may be performed by the bit de-interleaving unit 390 shown in FIG. 1.

Furthermore, the signaling information decoding method according to the embodiment of the present invention includes performing inverse zero removing at step S330.

In this case, step S330 may correspond to the inverse operation of step S280 shown in FIG. 2, and may be performed by the inverse zero removing unit 380 shown in FIG. 1.

Furthermore, the signaling information decoding method according to the embodiment of the present invention includes performing inverse parity puncturing at step S340.

In this case, step S340 may correspond to the inverse operation of step S270 shown in FIG. 2, and may be performed by the inverse parity puncturing unit 370 shown in FIG. 1.

Furthermore, the signaling information decoding method according to the embodiment of the present invention includes performing inverse parity permutation at step S350.

In this case, step S350 may correspond to the inverse operation of step S260 shown in FIG. 2, and may be performed by the inverse parity permutation unit 360 shown in FIG. 1.

Furthermore, the signaling information decoding method according to the embodiment of the present invention includes performing LDPC decoding at step S360.

In this case, step S360 may correspond to the inverse operation of step S250 shown in FIG. 2, and may be performed by the LDPC decoder 350 shown in FIG. 1.

Furthermore, the signaling information decoding method according to the embodiment of the present invention includes performing inverse zero padding at step S370.

In this case, step S370 may correspond to the inverse operation of step S240 shown in FIG. 2, and may be performed by the inverse zero padding unit 340 shown in FIG. 1.

Furthermore, the signaling information decoding method according to the embodiment of the present invention includes performing BCH decoding at step S380.

In this case, step S380 may correspond to the inverse operation of step S230 shown in FIG. 2, and may be performed by the BCH decoder 330 shown FIG. 1.

Furthermore, the signaling information decoding method according to the embodiment of the present invention includes performing inverse scrambling at step S390.

In this case, step S390 may correspond to the inverse operation of step S220 shown in FIG. 2, and may be performed by the inverse scrambling unit 320 shown in FIG. 1.

Furthermore, the signaling information decoding method according to the embodiment of the present invention includes performing inverse segmentation at step S395.

In this case, step S395 may correspond to the inverse operation of step S210 shown in FIG. 2, and may be performed by the inverse segmentation unit 310 shown in FIG. 1.

Figure 4:
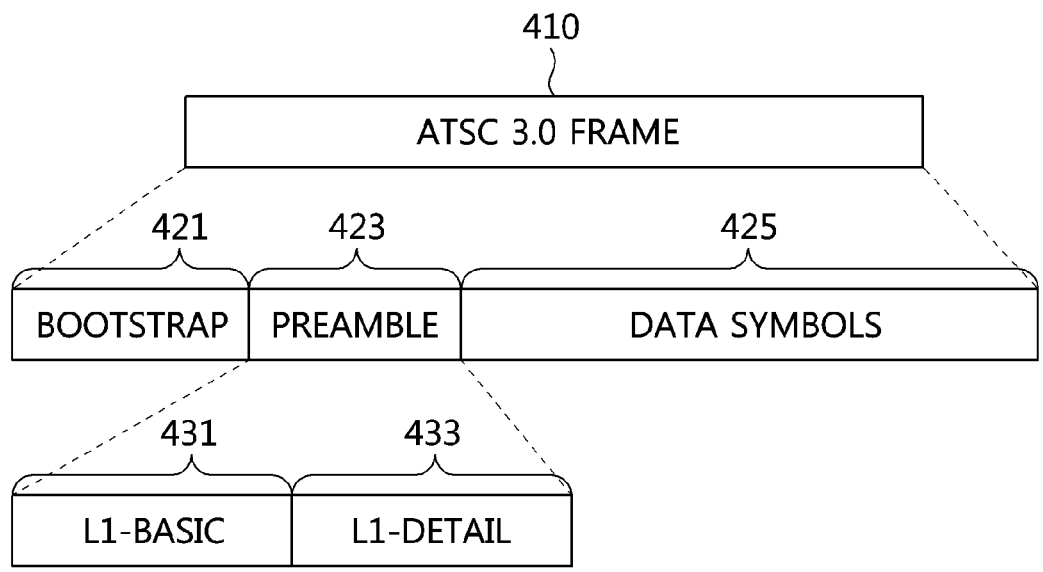
FIG. 4 is a diagram showing a broadcast signal frame according to an embodiment of the present invention.

FIG. 4 is a diagram showing a broadcast signal frame according to an embodiment of the present invention.

Referring to FIG. 4, the broadcast signal frame according to the embodiment of the present invention may include a bootstrap 421, a preamble 423, and data symbols 425.

The preamble 423 includes signaling information.

In an example shown in FIG. 4, the preamble 423 may include L1-Basic information 431 and L1-Detail information 433.

In this case, the L1-Basic information 431 may be fixed-length signaling information.

For example, the L1-Basic information 431 may correspond to fixed length 200 bits.

In this case, the L1-Detail information 433 may be variable length signaling information.

For example, the L1-Detail information 433 may correspond to 200 to 2352 bits.

An LDPC (low-density parity check) code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 9:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \quad (9)$$

for $a_{ij} \in \{0, 1, \ldots, L-1, \infty\}$

In this equation, J is a CPM having a size of L×L, and is given as Equation 10 below. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (10)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 5:
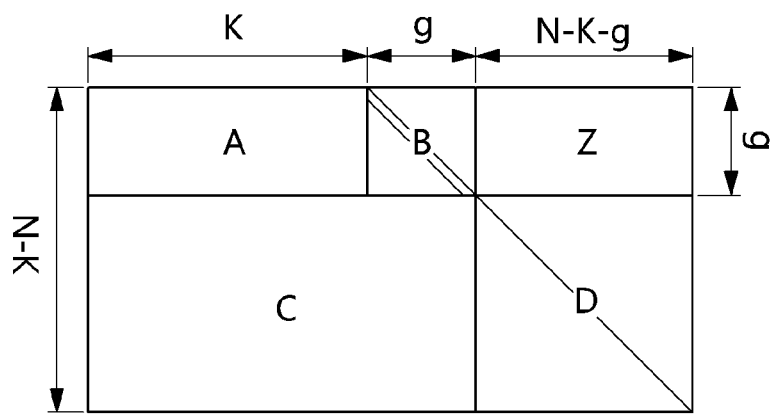
FIG. 5 is a diagram showing the structure of a parity check matrix (PCM) corresponding to an LDPC code according to an embodiment of the present invention.

FIG. 5 is a diagram showing the structure of a PCM corresponding to an LDPC code according to an embodiment of the present invention.

Referring to FIG. 5, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as Equation 11 below:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (11)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 11 above. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure shown in FIG. 5.

In this case, N is the length of a codeword, and K is the length of information.

The present invention proposes a newly designed QC-LDPC code whose code rate is 3/15 and whose codeword length is 16200, as shown in Table 5 below. That is, the present invention proposes an LDPC code that is designed to receive information having a length of 3240 and generate an LDPC codeword having a length of 16200.

Table 5 shows the sizes of the matrices A, B, C, D and Z of the QC-LDPC code according to the present invention:

TABLE 5

| Code rate | Length | Sizes | | | | |
|---|---|---|---|---|---|---|
| | | A | B | C | D | Z |
| 3/15 | 16200 | 1080 × 3240 | 1080 × 1080 | 11880 × 4320 | 11880 × 11880 | 1080 × 11880 |

The newly designed LDPC code may be represented in the form of a sequence, an equivalent relationship is established between the sequence and the matrix (parity bit check matrix), and the sequence may be represented as shown the following table:

TABLE

| 1st row: | 8 372 841 4522 5253 7430 8542 9822 10550 11896 11988 |
| 2nd row: | 80 255 667 1511 3549 5239 5422 5497 7157 7854 11267 |
| 3rd row: | 257 406 792 2916 3072 3214 3638 4090 8175 8892 9003 |
| 4th row: | 80 150 346 1883 6838 7818 9482 10366 10514 11468 12341 |
| 5th row: | 32 100 978 3493 6751 7787 8496 10170 10318 10451 12561 |
| 6th row: | 504 803 856 2048 6775 7631 8110 8221 8371 9443 10990 |
| 7th row: | 152 283 696 1164 4649 4514 7260 7370 11925 11986 12092 |
| 8th row: | 127 1034 1044 1842 3184 3397 5931 7577 11898 12339 12689 |
| 9th row: | 107 513 979 3934 4374 4658 7286 7809 8830 10804 10893 |
| 10th row: | 2045 2499 7197 8887 9420 9922 10132 10540 10816 11876 |
| 11st row: | 2932 6241 7136 7835 8541 9403 9817 11679 12377 12810 |
| 12nd row: | 2211 2288 3937 4310 5952 6597 9692 10445 11064 11272 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of a parity corresponding to the dual diagonal matrix B, and $M_2$ is the size of a parity corresponding to the identity matrix D. The encoding process is performed as follows:

Initialization:

$\lambda_i = s_i$ for $i = 0, 1, \ldots, K-1$ $p_j = 0$ for $j = 0, 1, \ldots, M_1 + M_2 - 1$ (12)

First information bit $\lambda_0$ is accumulated at parity bit addresses specified in the 1st row of the sequence of the above table. For example, in an LDPC code whose length is 16200 and whose code rate is 3/15, an accumulation process is as follows:

$$p_8 = p_8 \oplus \lambda_0$$
$$p_{372} = p_{372} \oplus \lambda_0$$
$$p_{841} = p_{841} \oplus \lambda_0$$
$$p_{4522} = p_{4522} \oplus \lambda_0$$
$$p_{5253} = p_{5253} \oplus \lambda_0$$
$$p_{7430} = p_{7430} \oplus \lambda_0$$
$$p_{8542} = p_{8542} \oplus \lambda_0$$
$$p_{9822} = p_{9822} \oplus \lambda_0$$
$$p_{10550} = p_{10550} \oplus \lambda_0$$
$$p_{11896} = p_{11896} \oplus \lambda_0$$
$$p_{11988} = p_{11988} \oplus \lambda_0$$

where the addition $\oplus$ occurs in GF(2).

The subsequent L−1 information bits, i.e., $\lambda_m$, m=1, 2, . . . , L−1, are accumulated at parity bit addresses that are calculated by the following Equation 13:

$$(x+m \times Q_1) \bmod M_1 \text{ if } x<M_1$$

$$M_1+\{(x-M_1+m \times Q_2) \bmod M_2\} \text{ if } x \geq M_1 \quad (13)$$

where x denotes the addresses of parity bits corresponding to the first information bit $\lambda_0$, i.e., the addresses of the parity bits specified in the first row of the sequence of Table, $Q_1=M_1/L$, $Q_2=M_2/L$, and L=360. Furthermore, $Q_1$ and $Q_2$ are defined in the following Table 2. For example, for an LDPC code whose length is 16200 and whose code rate is 3/15, $M_1=1080$, $Q_1=3$, $M_2=11880$, $Q_2=33$ and L=360, and the following operations are performed on the second bit $\lambda_1$ using Equation 13 above:

$$p_{11} = p_{11} \oplus \lambda_1$$
$$p_{375} = p_{375} \oplus \lambda_1$$
$$p_{844} = p_{844} \oplus \lambda_1$$
$$p_{4555} = p_{4555} \oplus \lambda_1$$
$$p_{5286} = p_{5286} \oplus \lambda_1$$
$$p_{7463} = p_{7463} \oplus \lambda_1$$
$$p_{8575} = p_{8575} \oplus \lambda_1$$
$$p_{9855} = p_{9855} \oplus \lambda_1$$
$$p_{10583} = p_{10583} \oplus \lambda_1$$
$$p_{11929} = p_{11929} \oplus \lambda_1$$
$$p_{12021} = p_{12021} \oplus \lambda_1$$

Table 6 shows the sizes of $M_1$, $Q_1$, $M_2$ and $O_2$ of the designed QC-LDPC code:

TABLE 6

| Code rate | Length | $M_1$ | $M_2$ | $Q_1$ | $Q_2$ |
|---|---|---|---|---|---|
| 3/15 | 16200 | 1080 | 11880 | 3 | 33 |

The addresses of parity bit accumulators for new 360 information bits ranging from $\lambda_L$ to $\lambda_{2L-1}$ are calculated and accumulated from Equation 13 using the second row of the sequence.

In a similar manner, for all groups composed of new L information bits, the addresses of parity bit accumulators are calculated and accumulated from Equation 13 using new rows of the sequence.

After all the information bits ranging from $\lambda_0$ to $\lambda_{K-1}$ have been exhausted, the operations of Equation 14 below are sequentially performed from i=1:

$$p_i = p_i \oplus p_{i-1} \text{ for } i=0,1, \ldots ,M_1-1 \quad (14)$$

Thereafter, when a parity interleaving operation, such as that of Equation 15 below, is performed, parity bits corresponding to the dual diagonal matrix B are generated:

$$\lambda_{K+L \cdot t+s} = p_{Q_1 \cdot s+t} \text{ for } 0 \leq s<L, 0 \leq t<Q_1 \quad (15)$$

When the parity bits corresponding to the dual diagonal matrix B have been generated using K information bits $\lambda_0$, $\lambda_1$, . . . , $\lambda_{K-1}$, parity bits corresponding to the identity matrix D are generated using the $M_1$ generated parity bits $\lambda_K$, $\lambda_{K+1}$, . . . , $\lambda_{K+M_1-1}$.

For all groups composed of L information bits ranging from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 13, and related operations are performed.

When a parity interleaving operation, such as that of Equation 16 below, is performed after all the bits ranging from $\lambda_K$ to $\lambda_{K+M_1-1}$ have been exhausted, a parity corresponding to the identity matrix D is generated:

$$\lambda_{K+M_1+L \cdot t+s} = p_{M_1+Q_2 \cdot s+t} \text{ for } 0 \leq s<L, 0 \leq t<Q_2 \quad (16)$$

Figure 6:
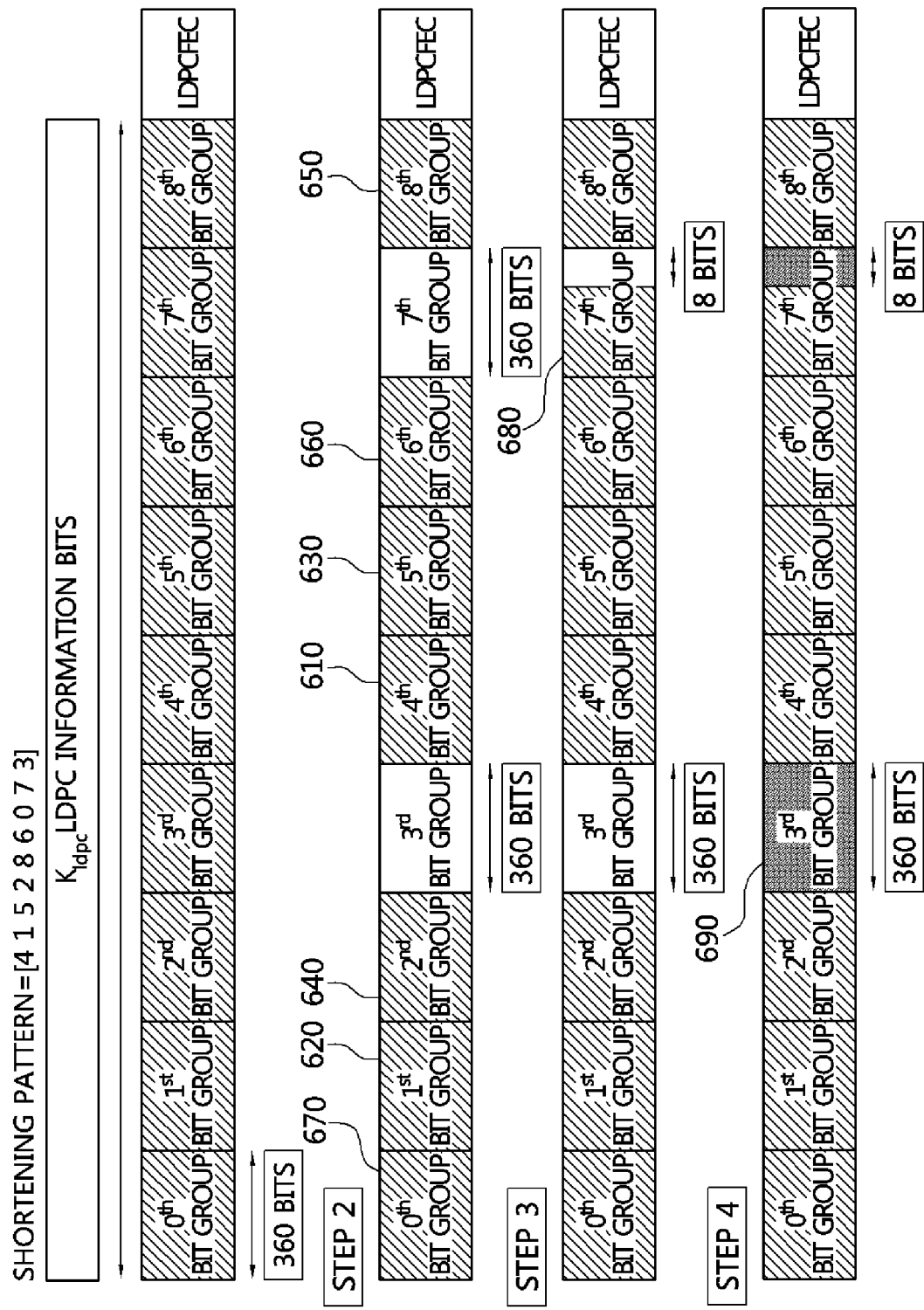
FIG. 6 is a diagram showing an example of the operation of the zero padding unit shown in FIG. 1.

FIG. 6 is a diagram showing an example of the operation of the zero padding unit shown in FIG. 1.

Referring to FIG. 6, a zero padding operation in the case where the shortening pattern order is [4 1 5 2 8 6 0 7 3] can be seen.

In the example shown in FIG. 6, the length of the LDPC information bit string is 3240, and thus LDPC information bits include 9 groups each composed of 360 bits.

First, when the number of groups for which all the bits thereof are filled with 0 is determined using Equation 2, (3240−368/360)=7.9, and thus 7 groups are determined to be the groups for which all the bits thereof are filled with 0.

Furthermore, since the shortening pattern order is [4 1 5 2 8 6 0 7 3], a total of 7 groups, a 5th group 610 indexed as 4, a 2nd group 620 indexed as 1, a 6th group 630 indexed as 5, a 3rd group 640 indexed as 2, a 9th group 650 indexed as 8, a 7th group 660 indexed as 6 and a 1st group 670 indexed as 0, are selected, and all the bits of the groups are filled with 0.

Furthermore, since an 8th group 680 indexed as 7 is next to the 1st group 670 indexed as 0, 352 (=3240−368−(360× 7)) bits from the beginning of the 8th group 680 indexed as 7 are filled with 0.

After the zero padding has been completed, the BCH-encoded bit string of $N_{bch}$ (=368) bits is sequentially mapped to a total of 368 bits, i.e., the 360 bits of the 4th group 690 indexed as 3 and the remaining 8 bits of the 8th group 680 indexed as 7.

Figure 7:
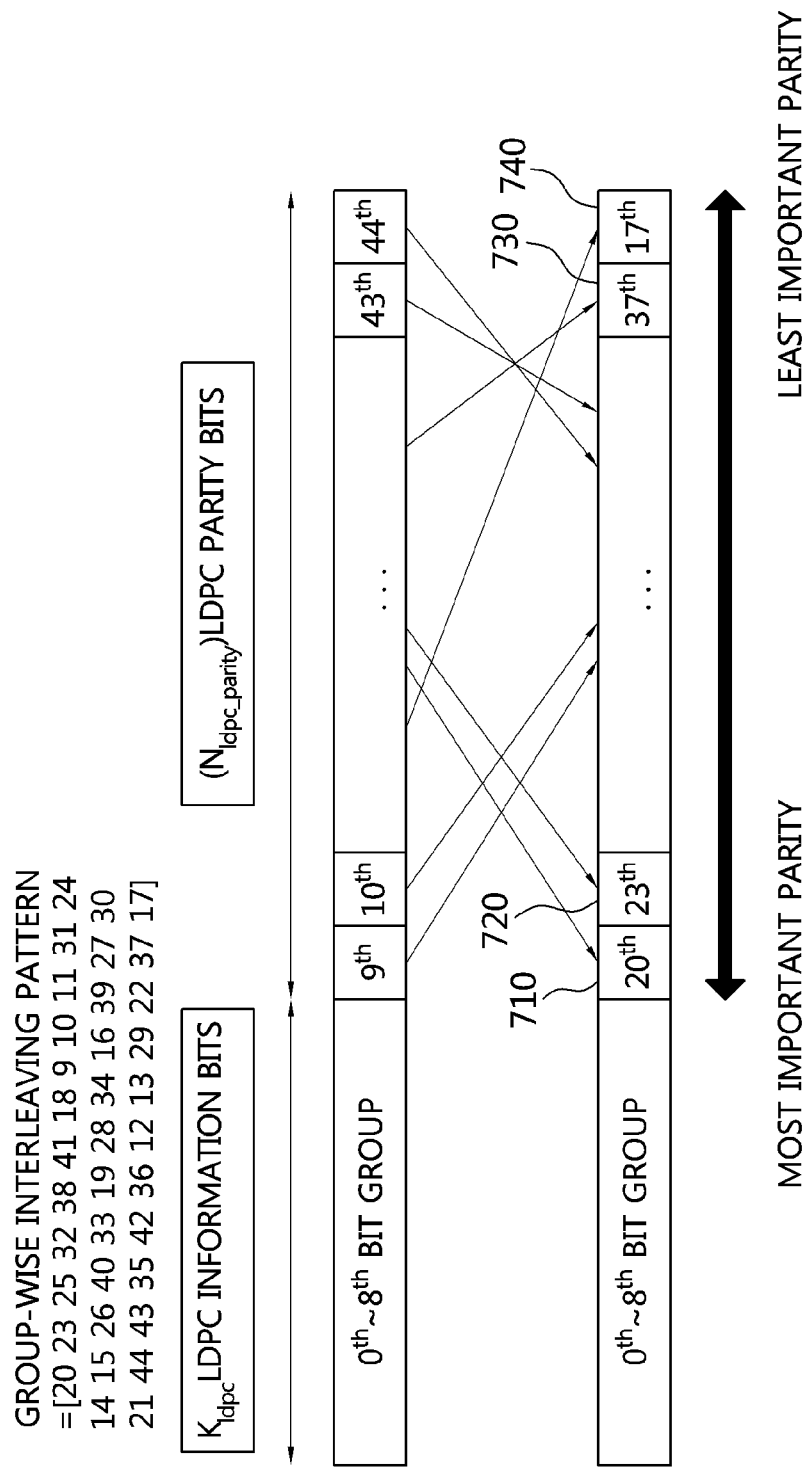
FIG. 7 is a diagram showing an example of the operation of the parity permutation unit shown in FIG. 1.

FIG. 7 is a diagram showing an example of the operation of the parity permutation unit shown in FIG. 1.

Referring to FIG. 7, a parity permutation operation in the case where the order of group-wise interleaving corresponding to the sequence [20 23 25 32 38 41 18 9 10 11 31 24 14 15 26 40 33 19 28 34 16 39 27 30 21 44 43 35 42 36 12 13 29 22 37 17] can be seen.

$K_{ldpc}$ (=3240) information bits are not interleaved, and 36 groups each composed of 360 bits (a total of 12960 bits) become an interleaving target.

Since the order of group-wise interleaving corresponds to the sequence [20 23 25 32 38 41 18 9 10 11 31 24 14 15 26 40 33 19 28 34 16 39 27 30 21 44 43 35 42 36 12 13 29 22 37 17], the parity permutation unit locates a 21st group indexed as 20 at a 10th group location 710 indexed as 9, a 24th group indexed as 23 at a 11th group location 720 indexed as 10, . . . , a 38th group indexed as 37 at a 44th group location 730 indexed as 43, and a 18th bit group indexed as 17 at a 45th group location 740 indexed as 44.

Figure 8:
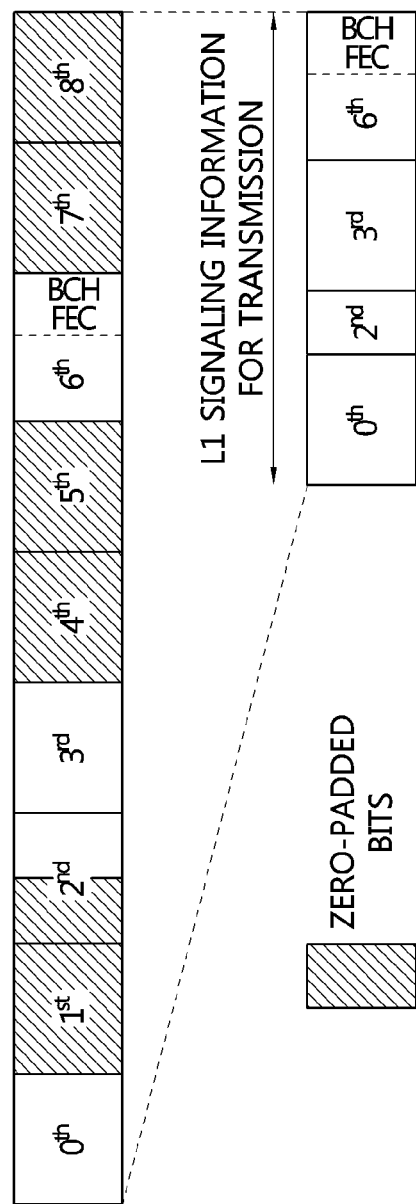
FIG. 8 is a diagram showing an example of the operation of the zero removing unit shown in FIG. 1.

FIG. 8 is a diagram showing an example of the operation of the zero removing unit shown in FIG. 1.

Referring to FIG. 8; it can be seen that the zero removing unit generates signaling information for transmission by removing zero-padded parts from the information part of an LDPC codeword.

Figure 9:
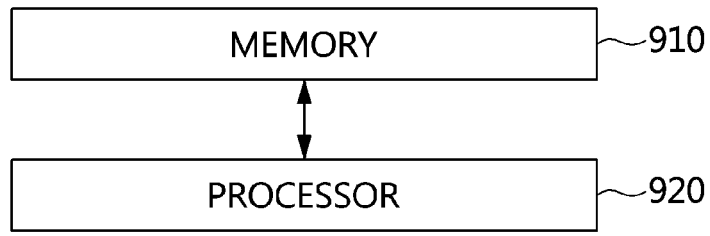
FIG. 9 is a block diagram showing a zero padding apparatus according to an embodiment of the present invention.

FIG. 9 is a block diagram showing a zero padding apparatus according to an embodiment of the present invention.

Referring to FIG. 9, the zero padding apparatus according to the embodiment of the present invention includes a processor 920, and memory 910.

The processor 920 generates a LDPC information bit string by deciding a number of groups whose all bits are to be filled with 0 using a difference between a length of the LDPC information bit string and a length of a BCH-encoded bit string ($K_{ldpc}-N_{bch}$), selecting the groups using a shortening pattern order to fill all the bits of the groups with 0; and filling at least a part of remaining groups; which are not filled with 0; with the BCH-encoded bit string.

In this case, the BCH-encoded bit string may correspond to fixed length signaling information. In this case, the fixed length signaling information may be L1-Basic information.

In this case, each of the groups may include 360 bits, the LDPC information bit string may include 3240 bits, and the LDPC encoder may correspond to an LDPC codeword whose length is 16200 and whose code rate is 3/15.

In this case; the processor 920 may decide a group which is partially to be filled with 0 using the shortening pattern order, and fill a number of bits corresponding to a number decided by using the difference between the length of the LDPC information bit string and the length of the BCH-encoded bit string ($K_{ldpc}-N_{bch}$) with 0 from the start of the group.

In this case; the shortening pattern order may be defined for 9 groups as shown in the Table 2.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

In this case, the LDPC codeword may be used for parity permutation which is performed by group-wise interleaving corresponding to an order of group-wise interleaving shown in the Table 3 and a part of parity bits of the LDPC codeword is punctured after the parity permutation.

The memory 910 provides the LDPC information bit string to an LDPC encoder.

The zero padding apparatus shown in FIG. 9 may correspond to the zero padding unit 140 shown in FIG. 1.

Furthermore, the structure shown in FIG. 9 may correspond to an inverse zero padding apparatus. In this case, the inverse zero padding apparatus may correspond to the inverse zero padding unit 340 shown in FIG. 1.

When the structure shown in FIG. 9 corresponds to the inverse zero padding apparatus, the memory 910 receives the LDPC information bit string from the LDPC decoder.

The processor 920 selects groups whose all bits are filled with 0 using a shortening pattern order and generates the BCH-encoded bit string from the LDPC information bit string using remaining groups exclusive of the groups.

In this case, the BCH-encoded bit string may correspond to fixed length signaling information. In this case, the fixed length signaling information may be L1-Basic information.

In this case, each of the groups may include 360 bits, the LDPC information bit string may include 3240 bits, and the LDPC encoder may correspond to an LDPC codeword whose length is 16200 and whose code rate is 3/15.

In this case, the shortening pattern order may be defined for 9 groups as shown in the Table 2.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

Figure 10:
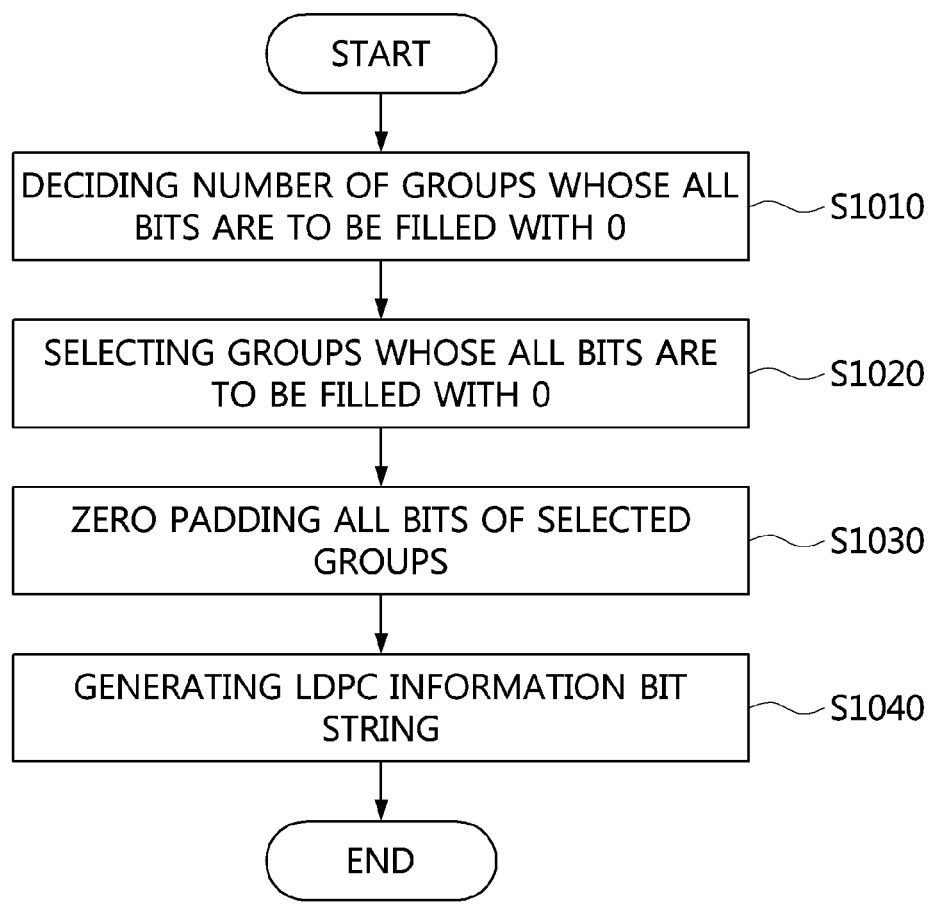
FIG. 10 is an operation flowchart showing a zero padding method according to an embodiment of the present invention.

FIG. 10 is an operation flowchart showing a zero padding method according to an embodiment of the present invention.

Referring to FIG. 10, the zero padding method according to the embodiment of the present invention includes deciding the number of groups whose all bits are to be filled with 0 using a difference between a length of an LDPC information bit string and a length of a BCH-encoded bit string at step S1010.

In this case, the BCH-encoded bit string may correspond to fixed length signaling information. In this case, the fixed length signaling information may be L1-Basic information.

In this case, each of the groups may include 360 bits, the LDPC information bit string may include 3240 bits, and the LDPC encoder may correspond to an LDPC codeword whose length is 16200 and whose code rate is 3/15.

In this case, the LDPC codeword may be used for parity permutation which is performed by group-wise interleaving corresponding to an order of group-wise interleaving and a part of parity bits of the LDPC codeword is punctured after the parity permutation.

Furthermore, the zero padding method according to the embodiment of the present invention includes selecting the groups using a shortening pattern order at step S1020.

In this case, the shortening pattern order may be defined for 9 groups as shown in the Table 2.

In this case, the shortening pattern order may correspond to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

Furthermore, the zero padding method according to the embodiment of the present invention includes filling all the bits of the selected groups with 0 at step 31030.

Furthermore, the zero padding method according to the embodiment of the present invention includes generating the LDPC information bit string by filling at least a part of remaining groups which are not filled with 0, with the BCH-encoded bit string at step S1040.

Although it is not shown in FIG. 10, the zero padding method according to the embodiment of the present invention may further include providing the LDPC information bit string to an LDPC encoder.

Moreover, the zero padding method according to the embodiment of the present invention may further include deciding a group which is partially to be filled with 0 using the shortening pattern order; and filling the number of bits corresponding to the number decided by using the difference between the length of the LDPC information bit string and the length of the BCH-encoded bit string with 0 from the start of the group.

As described above, the zero padding apparatus, the zero padding method and the inverse zero padding apparatus according to the present invention are not limited to the configurations and methods of the above-described embodiments, but some or all of the embodiments may be selectively combined such that the embodiments can be modified in various manners.

What is claimed is:

1. An inverse zero padding apparatus, comprising:
memory configured to store an LDPC information bit string restored from an LDPC decoder; and
a processor configured to select groups whose all bits are filled with 0 corresponding to a shortening pattern order and generate a BCH-encoded bit string from the LDPC information bit string using remaining groups exclusive of the groups,
wherein the shortening pattern order corresponds to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

2. The inverse zero padding apparatus of claim 1, wherein the BCH-encoded bit string corresponds to fixed length signaling information.

3. The inverse zero padding apparatus of claim 2, wherein each of the groups includes 360 bits, the LDPC information bit string includes 3240 bits, and the LDPC decoder corresponds to an LDPC codeword whose length is 16200 and whose code rate is 3/15.

4. An inverse zero padding method, comprising:
storing an LDPC information bit string restored from an LDPC decoder; and
generating a BCH-encoded bit string from the LDPC information bit string using remaining groups exclusive of groups whose all bits are filled with 0, the groups selected corresponding to a shortening pattern order,
wherein the shortening pattern order corresponds to an order of a 5th group indexed as 4, a 2th group indexed as 1, a 6th group indexed as 5, a 3rd group indexed as 2, a 9th group indexed as 8, a 7th group indexed as 6, a 1st group indexed as 0, a 8th group indexed as 7, and a fourth group indexed as 3.

* * * * *